(12) United States Patent
Suzuki

(10) Patent No.: US 8,922,223 B2
(45) Date of Patent: Dec. 30, 2014

(54) TIMER CIRCUIT

(75) Inventor: Koji Suzuki, Miyazaki (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 572 days.

(21) Appl. No.: 13/098,791

(22) Filed: May 2, 2011

(65) Prior Publication Data

US 2011/0291665 A1 Dec. 1, 2011

(30) Foreign Application Priority Data

May 27, 2010 (JP) .................................. 2010-122012

(51) Int. Cl.
G01R 31/12 (2006.01)
G01R 27/26 (2006.01)
H03H 11/26 (2006.01)
G04B 47/00 (2006.01)
G01R 31/02 (2006.01)

(52) U.S. Cl.
CPC .................................... G01R 31/028 (2013.01)
USPC .............. 324/548; 324/678; 327/261; 368/10

(58) Field of Classification Search
CPC ............................ G01R 31/028; G01R 31/016
USPC ........................................................ 324/548
See application file for complete search history.

(56) References Cited

U.S. PATENT DOCUMENTS 3,699,512 A * 10/1972 Hill et al. ....................... 340/919
4,547,629 A * 10/1985 Corless .......................... 379/412
4,590,444 A * 5/1986 Wilcox .......................... 331/111
4,686,526 A * 8/1987 Gritzo ............................... 713/2
4,703,390 A * 10/1987 Fay et al. ....................... 361/101
4,947,309 A * 8/1990 Jonsson ........................... 363/17
5,124,597 A * 6/1992 Stuebing et al. ............... 327/261
5,229,752 A * 7/1993 Gliebe et al. .................. 340/658
5,302,945 A * 4/1994 Stoltenberg .................... 340/660

(Continued)

FOREIGN PATENT DOCUMENTS

JP H11-312966 A 11/1999
JP 2000-241565 A 9/2000

OTHER PUBLICATIONS

Tony van Roon, 555 Timer Tutorial, 1995, http://www.sentex.ca/~mec1995/gadgets/555/555.html.*

(Continued)

Primary Examiner — Jermele M Hollington
Assistant Examiner — Christopher McAndrew
(74) Attorney, Agent, or Firm — Studebaker & Brackett PC

(57) ABSTRACT

A timer circuit is provided with a comparator CMP1, a control unit and a comparator CMP2. The comparator CMP1 compares a potential of the capacitance element with the potential of a reference voltage VREF_H, and if the potential of the capacitance element reaches the potential of the reference voltage VREF_H, outputs a pre-specified time-up signal. The control unit performs control such that the potential of the capacitance element is higher than a potential of a reference voltage VREF_S, which is higher than the ground potential and lower than the potential of the reference voltage VREF_H. The comparator CMP2 compares the potential of the capacitance element with the potential of the reference voltage VREF_S, and if the potential of the capacitance element is lower than the potential of the reference voltage VREF_S, outputs a short circuit detection signal indicating that a short circuit state of the capacitance element has been detected.

7 Claims, 10 Drawing Sheets

(56) References Cited

U.S. PATENT DOCUMENTS

| | | | |
|---|---|---|---|
| 5,311,486 A * | 5/1994 | Alton et al. | 368/10 |
| 5,450,521 A * | 9/1995 | Redlich | 388/829 |
| 5,460,210 A * | 10/1995 | Koeninger | 141/94 |
| 5,481,161 A * | 1/1996 | El-Hamamsy et al. | 315/224 |
| 5,565,819 A * | 10/1996 | Cooper | 331/111 |
| 5,621,600 A * | 4/1997 | Iijima | 361/93.6 |
| 5,670,915 A * | 9/1997 | Cooper et al. | 331/111 |
| 5,844,412 A * | 12/1998 | Norton | 324/548 |
| 6,016,105 A * | 1/2000 | Schweitzer, Jr. | 340/664 |
| 6,038,198 A * | 3/2000 | Phillips | 368/113 |
| 6,127,868 A * | 10/2000 | Phillips | 327/205 |
| 6,130,530 A * | 10/2000 | McNulty | 324/73.1 |
| 6,140,928 A * | 10/2000 | Shibuya et al. | 340/636.13 |
| 6,388,491 B1 | 5/2002 | Yamasaki et al. | |
| 6,437,579 B1 * | 8/2002 | Yamashita et al. | 324/548 |
| 7,307,485 B1 * | 12/2007 | Snyder et al. | 331/150 |
| 7,403,020 B2 * | 7/2008 | Braun et al. | 324/678 |
| 7,464,283 B2 * | 12/2008 | Teutsch et al. | 713/500 |
| 7,486,151 B2 * | 2/2009 | Goudo | 331/143 |
| 7,495,450 B2 * | 2/2009 | Furse et al. | 324/519 |
| 7,659,716 B2 * | 2/2010 | Nishikawa | 324/244 |
| 7,894,174 B2 * | 2/2011 | Moyer et al. | 361/93.1 |
| 8,067,948 B2 * | 11/2011 | Sequine | 324/678 |
| 8,358,519 B2 * | 1/2013 | Svensson | 363/56.02 |
| 8,643,993 B2 * | 2/2014 | Tsai et al. | 361/93.7 |
| 2007/0200540 A1 * | 8/2007 | Hashimoto et al. | 323/282 |
| 2009/0284264 A1 * | 11/2009 | Ng | 324/525 |
| 2011/0291665 A1 * | 12/2011 | Suzuki | 324/548 |

OTHER PUBLICATIONS

An Office Action; "Notice of Reasons for Rejection," issued by the Japanese Patent Office on Jan. 21, 2014, which corresponds to Japanese Patent Application No. 2010-122012 and is related to U.S. Appl. No. 13/098,791; with English language translation.

\* cited by examiner

TIMER CIRCUIT

CROSS-REFERENCE TO RELATED APPLICATION

This application claims priority under 35 USC 119 from Japanese Patent Application No. 2010-122012 filed on May 27, 2010, the disclosure of which is incorporated by reference herein.

BACKGROUND

1. Technical Field

The present invention relates to a timer circuit, and particularly relates to a timer circuit that utilizes charging and discharging of a capacitance element.

2. Related Art

Timer circuits that measure time by charging capacitors (hereinafter referred to as capacitance elements) external to the circuits (for example, see Japanese Patent Application Laid-Open (JP-A) No. 2000-241565) are commonly known as timer circuits that are used in semiconductor integrated circuits and the like.

FIG. 9 illustrates an example of a circuit diagram of a related art timer circuit that uses charging of a capacitance element C. As illustrated in FIG. 9, this configuration is provided with a comparator CMP, a reference voltage source that generates a reference voltage VREF, a charging circuit A for putting the capacitance element C into a charged state and a discharging circuit B for putting the capacitance element C into a discharged state. The capacitance element C is connected to the circuit by a capacitive element connection terminal.

The charging circuit A is provided with a resistance element R1 and a switch 51, and the discharging circuit B is provided with a resistance element R2 and a switch S2. A timer operation allowance signal is input to the switch 51 without being inverted, and the timer operation allowance signal is inverted by a NOT circuit and input to the switch S2. Thus, the charging circuit A and the discharging circuit B are connected to the capacitance element C exclusively.

FIG. 10 illustrates an operation timing chart of this related art timer circuit.

When the timer stops, the timer operation allowance signal is put to low level, the discharging circuit B is connected to the capacitance element C, and a state in which the capacitance element C is discharged is continued. When the timer starts, the timer operation allowance signal is put to high level, the charging circuit A is connected to the capacitance element C, and charging of the capacitance element C begins. Then, when the capacitance element C is charged up to the reference voltage VREF, a time-up signal is output from the comparator CMP.

Thus, the duration, from when charging of the capacitance element C is started until the time-up signal that is the output signal of the comparator CMP is output, is utilized as a timer duration. By the capacitance of the capacitance element C being changed, the timer duration may be set to an arbitrary timer duration. Therefore, this circuit may be utilized as a timer circuit in many semiconductor integrated circuits.

However, in the related art timer circuit described above, if a problem occurs in the external capacitance C, or foreign bodies or the like adhere to a circuit substrate and the capacitance element C is short-circuited, the timer does not get to time-up. Even if a spare timer circuit is provided, the spare timer circuit may not be switched to unless it can be detected that the capacitance element C is in the short-circuit state.

SUMMARY

The present invention is proposed to solve the problem described above, and provides a timer circuit that utilizes a capacitance element, the timer circuit being capable of detecting if the capacitance element is in a short circuit state.

In order to achieve the object described above, a timer circuit of a first aspect of the present invention includes: a first comparison unit that, after one of charging or discharging of a capacitance element is started, compares a potential of the capacitance element with a potential of a first reference voltage that is higher than a ground potential and lower than a power supply potential, and if the potential of the capacitance element reaches the potential of the first reference voltage, outputs a pre-specified time-up signal; a control unit that performs control such that the potential of the capacitance element is higher than a potential of a second reference voltage, which is higher than the ground potential and lower than the potential of the first reference voltage; and a second comparison unit that compares the potential of the capacitance element with the potential of the second reference voltage, and if the potential of the capacitance element becomes lower than the potential of the second reference voltage, outputs a detection signal indicating that a short circuit state of the capacitance element has been detected.

If the potential of the capacitance element were not controlled so as to be higher than the potential of the second reference voltage, then if the potential of the capacitance element was lower than the potential of the second reference voltage, it could not be judged whether the potential had been lowered by usual operations of charging and discharging or by a short circuit of the capacitance element. In the present invention, the potential of the capacitance element is controlled so as to be higher than the potential of the second reference voltage. Thus, if the potential of the capacitance element becomes lower than the potential of the second reference voltage in spite of this control, this indicates that the capacitance element has short-circuited. Therefore, a situation in which the capacitance element is short-circuited may be detected by comparing the potential of the capacitance element with the potential of the second reference voltage.

A timer circuit of a second aspect of the present invention includes: a first comparison unit that, after one of charging or discharging of a capacitance element is started, compares a potential of the capacitance element with a potential of a first reference voltage that is higher than a ground potential and lower than a power supply potential, and if the potential of the capacitance element reaches the potential of the first reference voltage, outputs a pre-specified time-up signal; a control unit that performs control such that the potential of the capacitance element is lower than a potential of a second reference voltage, which is higher than the potential of the first reference voltage and lower than the power supply potential; and a second comparison unit that compares the potential of the capacitance element with the potential of the second reference voltage, and if the potential of the capacitance element becomes higher than the potential of the second reference voltage, outputs a detection signal indicating that a short circuit state of the capacitance element has been detected.

If the potential of the capacitance element were not controlled so as to be lower than the potential of the second reference voltage, then if the potential of the capacitance element was higher than the potential of the second reference voltage, it could not be judged whether the potential had been raised by usual operations of charging and discharging or by a short circuit of the capacitance element. In the present invention, the potential of the capacitance element is controlled so as to be lower than the potential of the second reference voltage. Thus, if the potential of the capacitance element becomes higher than the potential of the second reference voltage in spite of this control, this indicates that the capacitance element has short-circuited. Therefore, a situation in which the capacitance element is short-circuited may be detected by comparing the potential of the capacitance element with the potential of the second reference voltage.

A timer circuit of a third aspect of the present invention includes: a first comparison unit that, after one of charging or discharging of a capacitance element is started, compares a potential of the capacitance element with a potential of a first reference voltage that is higher than a ground potential and lower than a power supply potential, and if the potential of the capacitance element reaches the potential of the first reference voltage, outputs a pre-specified time-up signal; a control unit that performs control such that the potential of the capacitance element is higher than a potential of a second reference voltage, which is higher than the ground potential and lower than the potential of the first reference voltage, and that performs control such that the potential of the capacitance element is higher than a potential of a third reference voltage, which is higher than the potential of the first reference voltage and lower than the power supply potential; a second comparison unit that compares the potential of the capacitance element with the potential of the second reference voltage, and if the potential of the capacitance element becomes lower than the potential of the second reference voltage, outputs a first detection signal indicating that a short circuit state of the capacitance element has been detected; and a third comparison unit that compares the potential of the capacitance element with the potential of the third reference voltage, and if the potential of the capacitance element becomes higher than the potential of the third reference voltage, outputs a second detection signal indicating that a short circuit state of the capacitance element has been detected.

If the potential of the capacitance element were not controlled so as to be higher than the potential of the second reference voltage, then if the potential of the capacitance element was lower than the potential of the second reference voltage, it could not be judged whether the potential had been lowered by usual operations of charging and discharging or by a short circuit of the capacitance element. If the potential of the capacitance element were not controlled so as to be lower than the potential of the third reference voltage, then if the potential of the capacitance element was higher than the potential of the third reference voltage, it could not be judged whether the potential had been raised by usual operations of charging and discharging or by a short circuit of the capacitance element. Accordingly, in the present invention, the potential of the capacitance element is compared with the potential of the second reference voltage and is compared with the potential of the third reference voltage in the state in which the potential of the capacitance element is controlled so as to be higher than the potential of the second reference voltage and lower than the potential of the third reference voltage. Therefore, a situation in which the capacitance element is short-circuited may be detected.

A timer circuit of a fourth aspect of the present invention includes: a charging and discharging control unit that performs control such that one of discharging or charging of a capacitance element is performed during a period in which a timer operation allowance signal input from outside of the timer circuit is at a first level, and the other of discharging or charging of the capacitance element is performed during a period in which the timer operation allowance signal is at a second level; a comparison unit that, in one of the period in which the timer operation allowance signal is at the first level or the period in which the timer operation allowance signal is at the second level, compares a potential of the capacitance element with a potential of a first reference voltage that is higher than a ground potential and lower than a power supply potential and, in a period in which the potential of the capacitance element reaches the potential of the first reference voltage, outputs a pre-specified output signal; and a detection unit that, if the output signal is output from the comparison unit in the other of the period in which the timer operation allowance signal is at the first level or the period in which the timer operation allowance signal is at the second level, outputs a detection signal indicating that a short circuit state of the capacitance element has been detected.

If, for example, charging is performed while the timer is stopped and the timer duration is measured by the discharging, then if the capacitance element is short-circuited to the ground potential, the capacitance element goes into a state in which the potential does not rise even in the charging period while the timer is stopped but is lower than the potential of the first reference voltage. Conversely, if the timer duration is measured by charging, then if the capacitance element is short-circuited to the power supply potential, the capacitance element goes into a state in which the potential does not fall even in the discharging period while the timer is stopped but is higher than the potential of the first reference voltage. The present invention detects these with the detection unit.

BRIEF DESCRIPTION OF THE DRAWINGS

Exemplary embodiments of the present invention will be described in detail based on the following figures, wherein.

DETAILED DESCRIPTION

Herebelow, embodiments are described in detail with reference to the attached drawings.

First Embodiment

Figure 1:
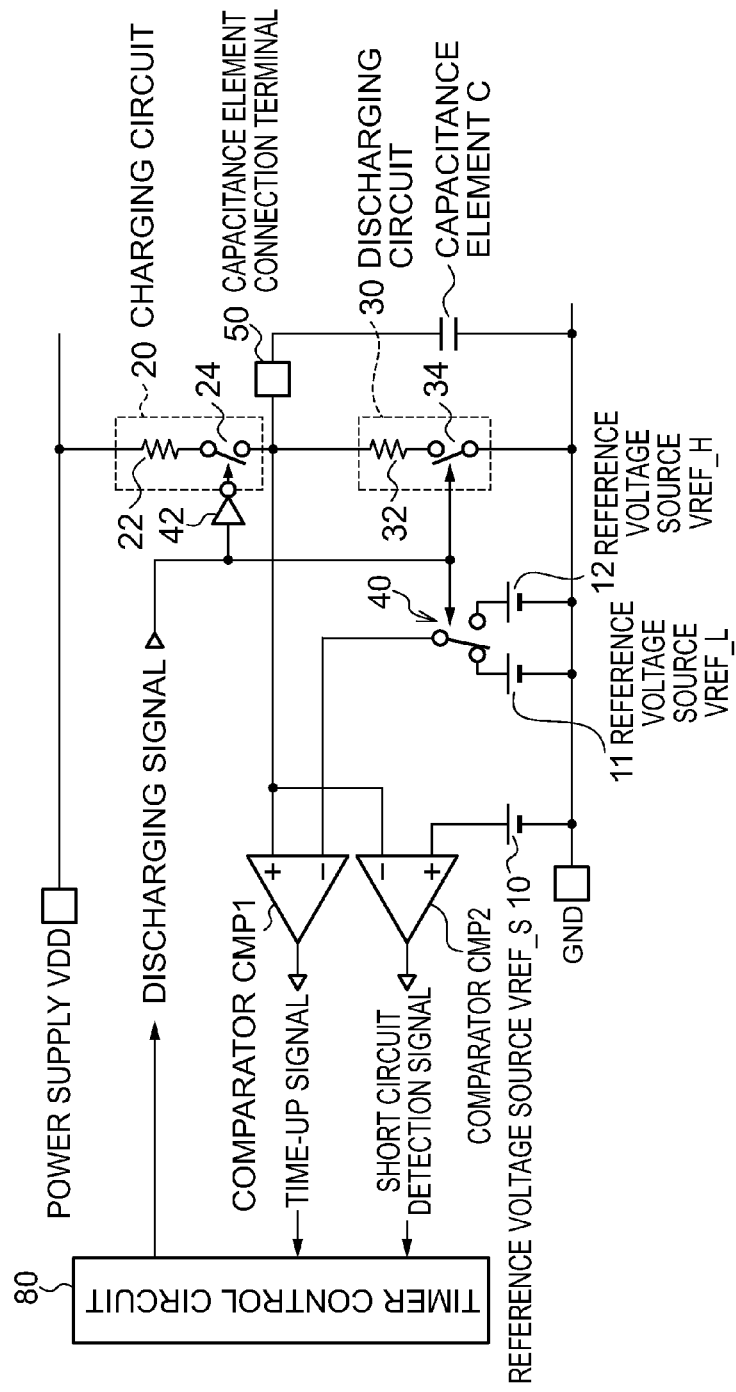
FIG. 1 is a circuit diagram illustrating a timer circuit relating to a first embodiment.

FIG. 1 is a circuit diagram illustrating a timer circuit relating to a first embodiment of the present invention. As illustrated in FIG. 1, the timer circuit is provided with a comparator CMP1, a comparator CMP2, a reference voltage source 10 that generates a reference voltage VREF_S, a reference voltage source 11 that generates a reference voltage VREF_L, a reference voltage source 12 that generates a reference voltage VREF_H, a switch 40, a NOT circuit 42, a charging circuit 20 for putting a capacitance element C into a charged state, and a discharging circuit 30 for putting the capacitance element C into a discharged state.

The charging circuit 20 and the discharging circuit 30 are connected to a capacitance element connection terminal 50. One end of the capacitance element C is connected to the capacitance element connection terminal 50, and the other end of the capacitance element C is connected to ground GND.

Now, the configurations of the charging circuit 20 and the discharging circuit 30 are described.

The charging circuit 20 is provided with a resistance element 22 and a switch 24. One end of the resistance element 22 is connected to a power supply that supplies a power supply voltage VDD, and the other end of the resistance element 22 is connected to one end of the switch 24. The other end of the switch 24 is connected to the capacitance element connection terminal 50.

The discharging circuit 30 is provided with a resistance element 32 and a switch 34. One end of the resistance element 32 is connected to the capacitance element connection terminal 50, and the other end of the resistance element 32 is connected to one end of the switch 34. The other end of the switch 34 is connected to the ground GND.

A discharging signal is inverted by the NOT circuit 42 and input to the switch 24 of the charging circuit 20, and the discharging signal is input to the switch 34 of the discharging circuit 30 without being inverted. Each of the switches 24 and 34 turns on when an input signal is at high level and turns off when an input signal is at low level. Therefore, the charging circuit 20 and the discharging circuit 30 are controlled by the discharging signal so as to operate exclusively. Here, the discharging signal is output by a timer control circuit 80.

The positive input terminal of the comparator CMP1 and the negative input terminal of the comparator CMP2 are connected to the capacitance element connection terminal 50.

The switch 40 is connected to the negative input terminal of the comparator CMP1. When the discharging signal is at high level, the switch 40 is in a first state in which the negative input terminal of the comparator CMP1 is connected with the reference voltage source 11, and when the discharging signal is at low level, the switch 40 is in a second state in which the negative input terminal of the comparator CMP1 is connected with the reference voltage source 12. Thus, the two reference voltages VREF_L and VREF_H are selected by the discharging signal and input to the negative input terminal of the comparator CMP1.

The comparator CMP1 compares the potential of the capacitance element C, which is input to the positive input terminal, with the reference voltage VREF_L or VREF_H that is input to the negative input terminal, and outputs a time-up signal in accordance with results of the comparison. Specifically, in a state in which the potential of the capacitance element C is lower than the potential of the reference voltage, the comparator CMP1 outputs the time-up signal at low level, and in a state in which the potential of the capacitance element C is higher than the potential of the reference voltage, the comparator CMP1 outputs the time-up signal at high level. Thus, the output level inverts when the potential of the capacitance element C crosses the potential of the reference voltage.

The reference voltage source 10 is connected to the positive input terminal of the comparator CMP2, and inputs the reference voltage VREF_S. The comparator CMP2 compares the potential of the capacitance element C, which is input to the negative input terminal, with the reference voltage VREF_S that is input to the positive input terminal, and outputs a short circuit detection signal in accordance with results of the comparison. Specifically, in a state in which the potential of the capacitance element C is higher than the potential of the reference voltage VREF_S, the comparator CMP2 outputs the short circuit detection signal at low level, and in a state in which the potential of the capacitance element C is lower than the potential of the reference voltage VREF_S, the comparator CMP2 outputs the short circuit detection signal at high level. Thus, the output level inverts when the potential of the capacitance element C crosses the potential of the reference voltage VREF_S.

The output signals of the comparators CMP1 and CMP2 are input to the timer control circuit 80.

Herein, size relationships of the potentials of the reference voltages VREF_S, VREF_L and VREF_H are as in the following expression (1).

$$GND < VREF\_S < VREF\_L < VREF\_H < VDD \tag{1}$$

Figure 2:
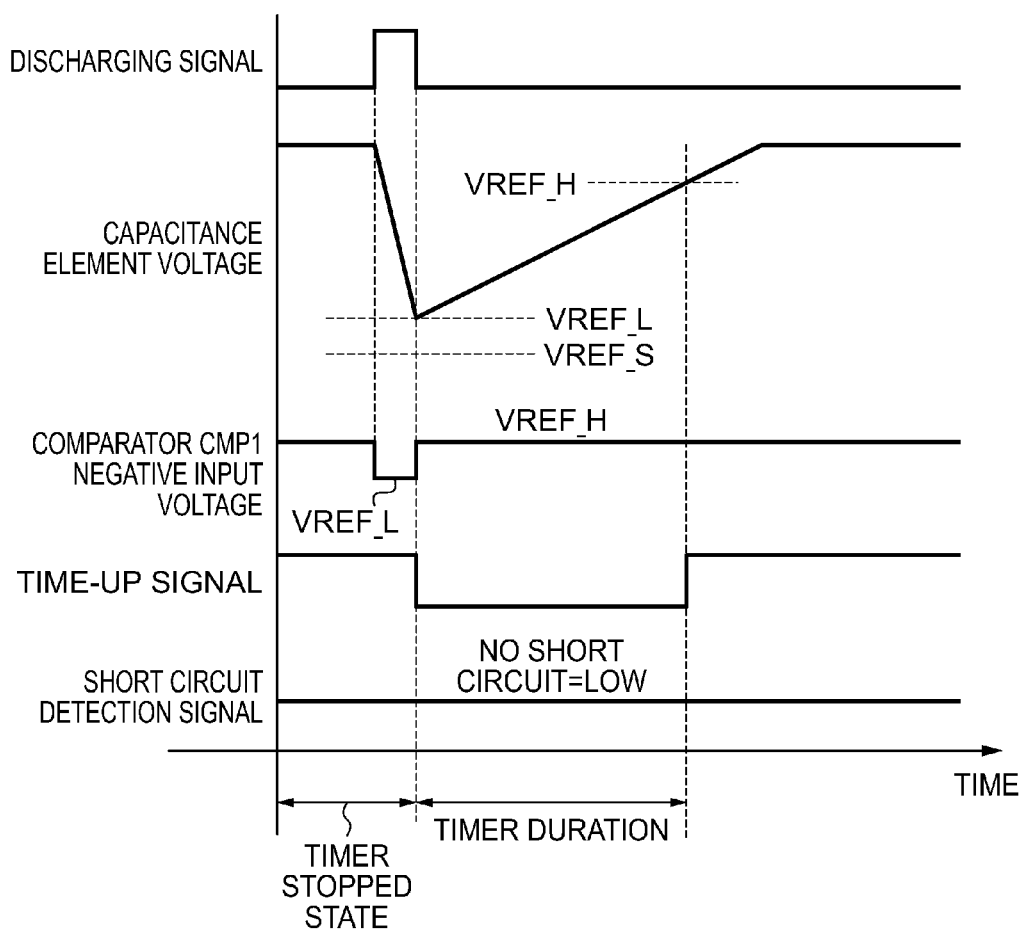
FIG. 2 is a diagram illustrating an operation timing chart of the first embodiment.

FIG. 2 illustrates an operation timing chart of the first embodiment. In a timer stopped state, the discharging signal is in a (low level) state in which discharging of the capacitance element C is prohibited, and the capacitance element C is in a charged state due to the charging circuit 20. Therefore, the capacitance element C is in a state that is charged up to the power supply voltage VDD.

Next, before a timer starts, the discharging signal goes into a (high level) state discharge of the capacitance element C is allowed, and the capacitance element C starts to be discharged by the discharging circuit 30. The discharging signal is held at high level until the output signal of the comparator CMP1 changes to low level. At this time, the voltage reference VREF_L is being input to the negative input terminal of the comparator CMP1.

When the capacitance element C has discharged and the potential of the capacitance element C reaches the potential of the reference voltage VREF_L, the output signal of the comparator CMP1 (the time-up signal) goes to low level. When the output signal of the comparator CMP1 goes to low level, the timer control circuit 80 switches the discharging signal to low level. Hence, discharge of the capacitance element is prohibited, and charging of the capacitance element C by the charging circuit 20 is started (timer is to start).

The reference voltage VREF_H is input to the negative input terminal of the comparator CMP1, and when the potential of the capacitance element C reaches the reference voltage VREF_H, the output signal of the comparator CMP1 (the time-up signal) changes to high level.

Accordingly, the timer duration corresponds to a low level region of the output signal of the comparator CMP1.

Thus, the potential of the capacitance element C is a potential between the reference voltage VREF_L and the power supply voltage VDD. During proper operations, the potential of the capacitance element C does not reach the reference voltage VREF_S whose potential is lower than the potential of the reference voltage VREF_L. Therefore, the short circuit detection signal of the comparator CMP2 is held at low level.

However, if the capacitance element C goes into a short circuit state at the potential level of the ground GND, due to a problem occurring at the capacitance element C or the like, the potential of the capacitance element C goes below the reference voltage VREF_S. Therefore, the short circuit detection signal of the comparator CMP2 goes to high level and notifies the timer control circuit 80 that the capacitance element C is in the short circuit state. The timer control circuit 80 senses this and may, for example, execute timer operations with a different timer circuit or the like.

As described above, according to the first embodiment, because the potential at the start of charging of the capacitance element C is set not to the GND level but to the potential of the reference voltage VREF_L that is higher than the GND level, a short circuit of the capacitance element C to the ground GND may be detected, and a timer circuit with high reliability may be realized.

Second Embodiment

Figure 3:
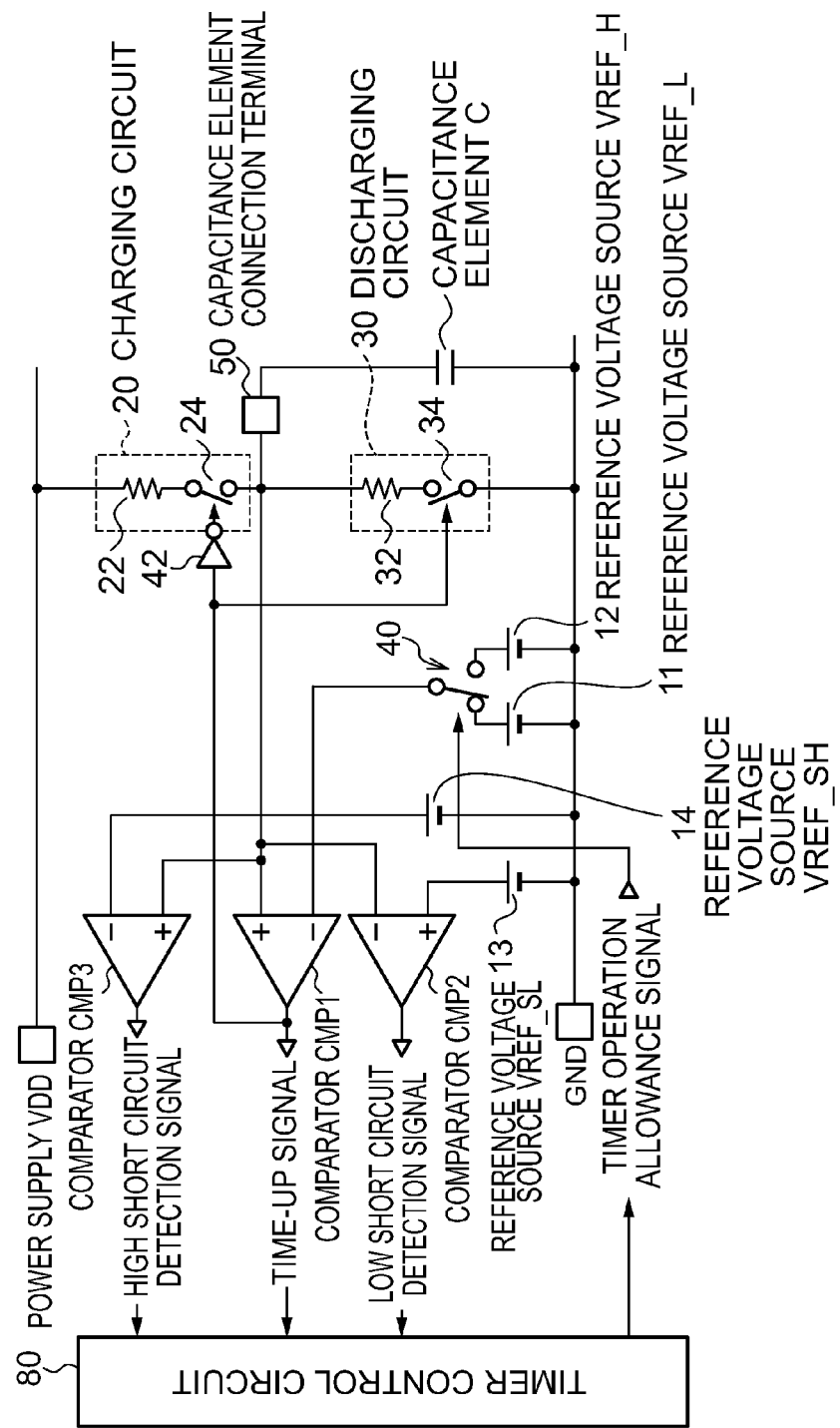
FIG. 3 is a circuit diagram illustrating a timer circuit relating to a second embodiment.

FIG. 3 is a circuit diagram illustrating a timer circuit relating to a second embodiment. Here, structural elements that are the same as in the timer circuit of the first embodiment that has been described using FIG. 1 are assigned the same reference numerals and are not described in detail.

As illustrated in FIG. 3, the timer circuit relating to the present embodiment is provided with the comparator CMP1, the comparator CMP2, a comparator CMP3, a reference voltage source 13 that generates a reference voltage VREF_SL, the reference voltage source 11 that generates the reference voltage VREF_L, the reference voltage source 12 that generates the reference voltage VREF_H, a reference voltage source 14 that generates a reference voltage VREF_SH, the switch 40, the NOT circuit 42, the charging circuit 20 and the discharging circuit 30.

In the timer circuit relating to the present embodiment, the same as in the first embodiment, the charging circuit 20 and the discharging circuit 30 are connected to the capacitance element connection terminal 50 to which the capacitance element C is connected.

The switch 24 of the charging circuit 20 and the switch 34 of the discharging circuit 30 are controlled to turn on and off by the time-up signal of the comparator CMP1. Specifically, the time-up signal is inverted by the NOT circuit 42 and input to the switch 24 of the charging circuit 20, and the time-up signal is input to the switch 34 of the discharging circuit 30 without being inverted. Each of the switches 24 and 34 turns on when an input signal is at high level and turns off when an input signal is at low level. Therefore, the charging circuit 20 and the discharging circuit 30 are controlled by the time-up signal so as to operate exclusively.

The positive input terminal of the comparator CMP1, the negative input terminal of the comparator CMP2 and the positive input terminal of the comparator CMP3 are connected to the capacitance element connection terminal 50.

The same as in the first embodiment, the switch 40 is connected to the negative input terminal of the comparator CMP1. In the present embodiment, when the timer operation allowance signal input from the timer control circuit 80 is at low level, the switch 40 is in the first state in which the negative input terminal of the comparator CMP1 is connected with the reference voltage source 11, and when the timer operation allowance signal is at high level, the switch 40 is in the second state in which the negative input terminal of the comparator CMP1 is connected with the reference voltage source 12. Thus, one of the two reference voltages VREF_L and VREF_H is selected by the timer operation allowance signal and input to the negative input terminal of the comparator CMP1. A period in which the timer operation allowance signal is at high level is a period in which timer operation is allowed and a period in which the timer operation allowance signal is at low level is a period in which timer operation is prohibited.

The reference voltage source 13 is connected to the positive input terminal of the comparator CMP2, and inputs the reference voltage VREF_SL. The comparator CMP2 compares the potential of the capacitance element C that is input to the negative input terminal with the reference voltage VREF_SL that is input to the positive input terminal, and outputs a low short circuit detection signal in accordance with results of the comparison. Specifically, in a state in which the potential of the capacitance element C is higher than the potential of the reference voltage VREF_SL, the comparator CMP2 outputs the low short circuit detection signal at low level, and in a state in which the potential of the capacitance element C is lower than the potential of the reference voltage VREF_SL, the comparator CMP2 outputs the low short circuit detection signal at high level. Thus, the output level inverts when the potential of the capacitance element C crosses the potential of the reference voltage VREF_SL.

The reference voltage source 14 is connected to the negative input terminal of the comparator CMP3, and inputs the reference voltage VREF_SH. The comparator CMP3 compares the potential of the capacitance element C, which is input to the positive input terminal, with the reference voltage VREF_SH that is input to the negative input terminal, and outputs a high short circuit detection signal in accordance with results of the comparison. Specifically, in a state in which the potential of the capacitance element C is lower than the potential of the reference voltage VREF_SH, the comparator CMP3 outputs the high short circuit detection signal at low level, in a state in which the potential of the capacitance element C is higher than the potential of the reference voltage VREF_SH, the comparator CMP3 outputs the high short circuit detection signal at high level, and the output level inverts when the potential of the capacitance element C crosses the potential of the reference voltage VREF_SH.

Herein, size relationships of the potentials of the reference voltages VREF_SL, VREF_L, VREF_H and VREF_SH are as in the following expression (2).

$$GND<VREF\_SL<VREF\_L<VREF\_H<VREF\_SH<VDD \quad (2)$$

Figure 4:
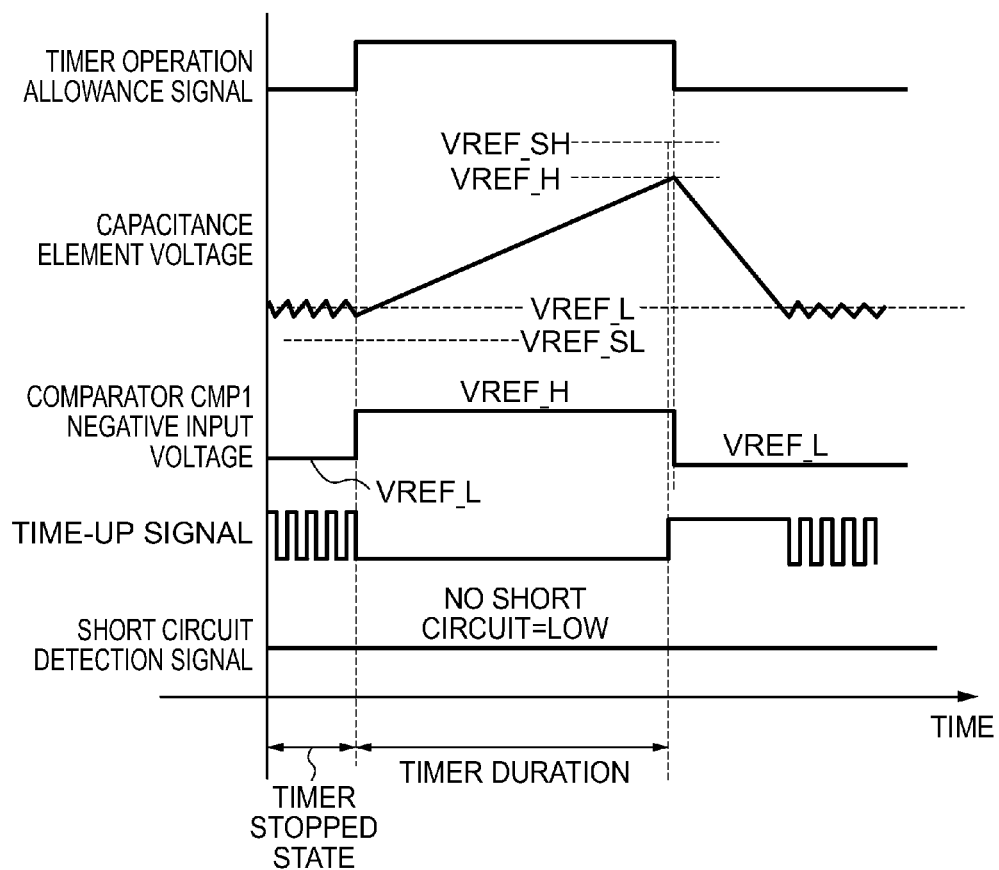
FIG. 4 is a diagram illustrating an operation timing chart of the second embodiment.

FIG. 4 illustrates an operation timing chart of the second embodiment. In the timer stopped state, the timer operation allowance signal is at low level and the reference voltage VREF_L is input to the negative input terminal of the comparator CMP1. Therefore, the time-up signal is repeatedly inverted with a short period, and the charging circuit 20 and the discharging circuit 30 are operated alternatingly. Therefore, the capacitance element C operates to repeatedly charge and discharge about the reference voltage VREF_L.

Next, when the timer is to start, the timer operation allowance signal goes to high level, the switch 40 switches into the second state, and because the reference voltage VREF_H is input to the negative input terminal of the comparator CMP1, the capacitance element C is charged up to the reference voltage VREF_H.

When the capacitance element C has charged to the reference voltage VREF_H, the output of the comparator CMP1 goes to low level and the timer control circuit 80 is informed that the timer is at time-up.

The timer control circuit 80 senses that the time-up signal is at high level and switches the timer operation allowance signal to low level. Hence, the switch 40 switches to the first state, and the reference voltage VREF_L is input to the negative input terminal of the comparator CMP1. The capacitance element C is discharged to the reference voltage VREF_L, and then operates to repeatedly charge and discharge about the reference voltage VREF_L.

Thus, during proper operations, the potential of the capacitance element C does not reach the reference voltage VREF_SL whose potential is lower than the potential of the reference voltage VREF_L and the potential of the capacitance element C does not reach the reference voltage VREF_SH whose potential is higher than the potential of the reference voltage VREF_H. Therefore, the low short circuit detection signal of the comparator CMP2 and the high short circuit detection signal of the comparator CMP3 are held at low level.

However, if the capacitance element C goes into a short circuit state at the ground GND level, due to a problem occurring at the capacitance element C or the like, the potential of the capacitance element C goes below the reference voltage VREF_SL. Therefore, the low short circuit detection signal of the comparator CMP2 goes to high level and notifies the timer control circuit 80 that the capacitance element C is in a short circuit state.

On the other hand, if the capacitance element C goes into a short circuit state at the power supply VDD level, due to, for example, a problem occurring at the external capacitance C or adherence of a foreign body or the like, the potential of the capacitance element C goes above the reference voltage VREF_SH. Therefore, the high short circuit detection signal of the comparator CMP3 goes to high level and notifies the timer control circuit 80 that the capacitance element C is in a short circuit state.

The timer control circuit 80 senses the low short circuit detection signal or the high short circuit detection signal and may, for example, execute timer operations with a different timer circuit or the like.

As described above, according to the second embodiment, because the potential value of the capacitance element C is set to an intermediate value higher than the potential of the ground GND and lower than the potential of the power supply VDD, a short circuit of the capacitance element C to GND or to the power supply VDD may be detected, and a timer circuit with high reliability may be realized.

Third Embodiment

Figure 5:
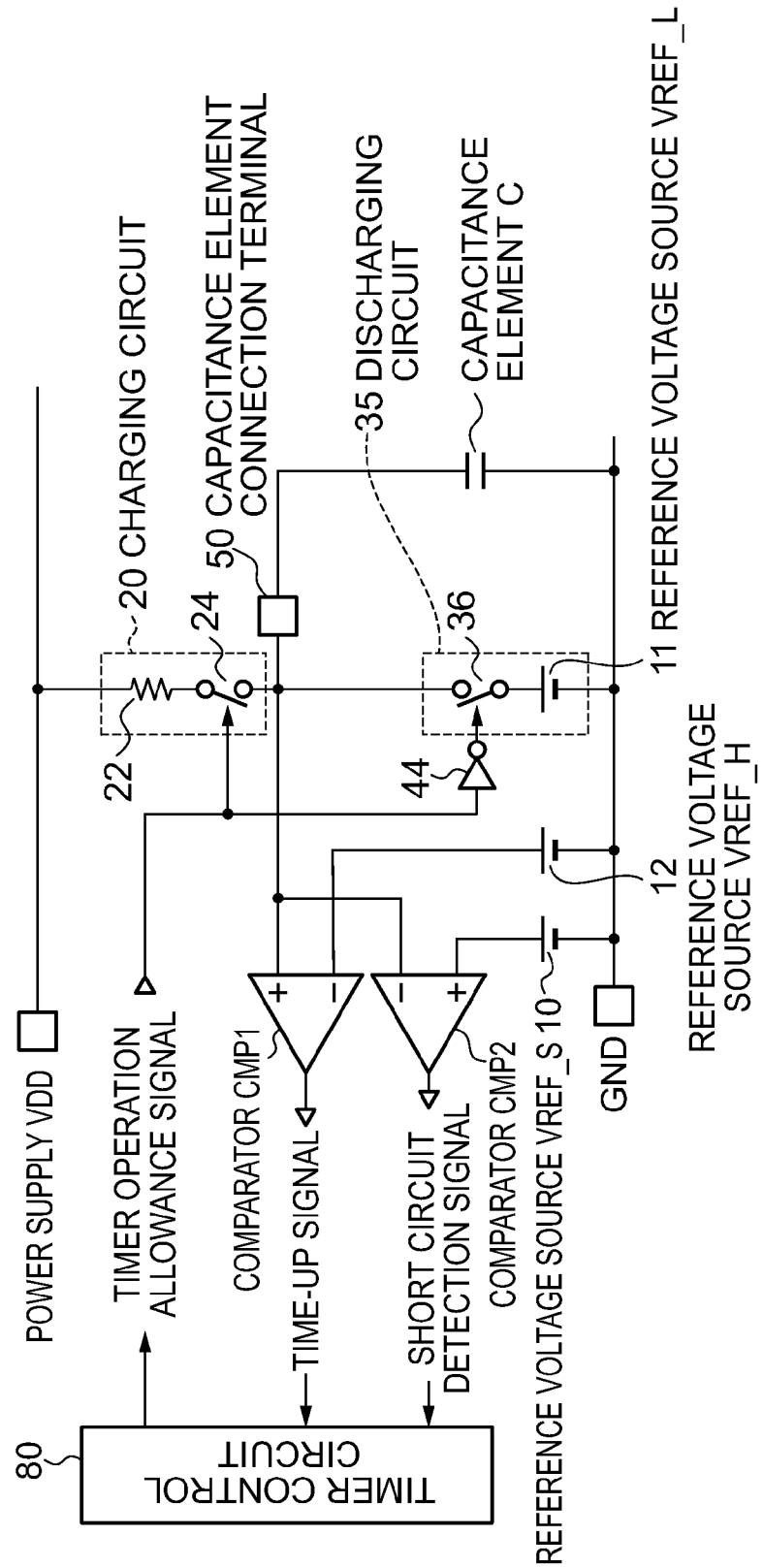
FIG. 5 is a circuit diagram illustrating a timer circuit relating to a third embodiment.

FIG. 5 is a circuit diagram illustrating a timer circuit relating to a third embodiment. Here, structural elements that are the same as in the timer circuit of the first embodiment that has been described using FIG. 1 are assigned the same reference numerals and are not described in detail.

As illustrated in FIG. 5, the timer circuit relating to the present embodiment is provided with the comparator CMP1, the comparator CMP2, the reference voltage source 10, the reference voltage source 12, a NOT circuit 44, the charging circuit 20 and a discharging circuit 35.

The charging circuit 20 and the discharging circuit 35 are connected to the capacitance element connection terminal 50 to which the capacitance element C is connected.

The charging circuit 20 has the same configuration as in the first embodiment. The discharging circuit 35 is provided with a switch 36 and the reference voltage source 11. One end of the switch 36 is connected to the capacitance element connection terminal 50, and the other end is connected to the reference voltage source 11.

The timer operation allowance signal is input to the switch 24 of the charging circuit 20 without being inverted, and the timer operation allowance signal is inverted by the NOT circuit 44 and input to the switch 36 of the discharging circuit 30. Each of the switches 24 and 36 turns on when an input signal is at high level and turns off when an input signal is at low level. Therefore, the charging circuit 20 and the discharging circuit 35 are controlled by the time-up signal so as to operate exclusively. The timer operation allowance signal is output by the timer control circuit 80.

The positive input terminal of the comparator CMP1 and the negative input terminal of the comparator CMP2 are connected to the capacitance element connection terminal 50.

The reference voltage source 12 is connected to the negative input terminal of the comparator CMP1 and inputs the reference voltage VREF_H.

The reference voltage source 10 is connected to the positive input terminal of the comparator CMP2 and inputs the reference voltage VREF_S.

The size relationships of the potentials of the reference voltages VREF_S, VREF_L and VREF_H are as in expression (1) of the first embodiment.

Figure 6:
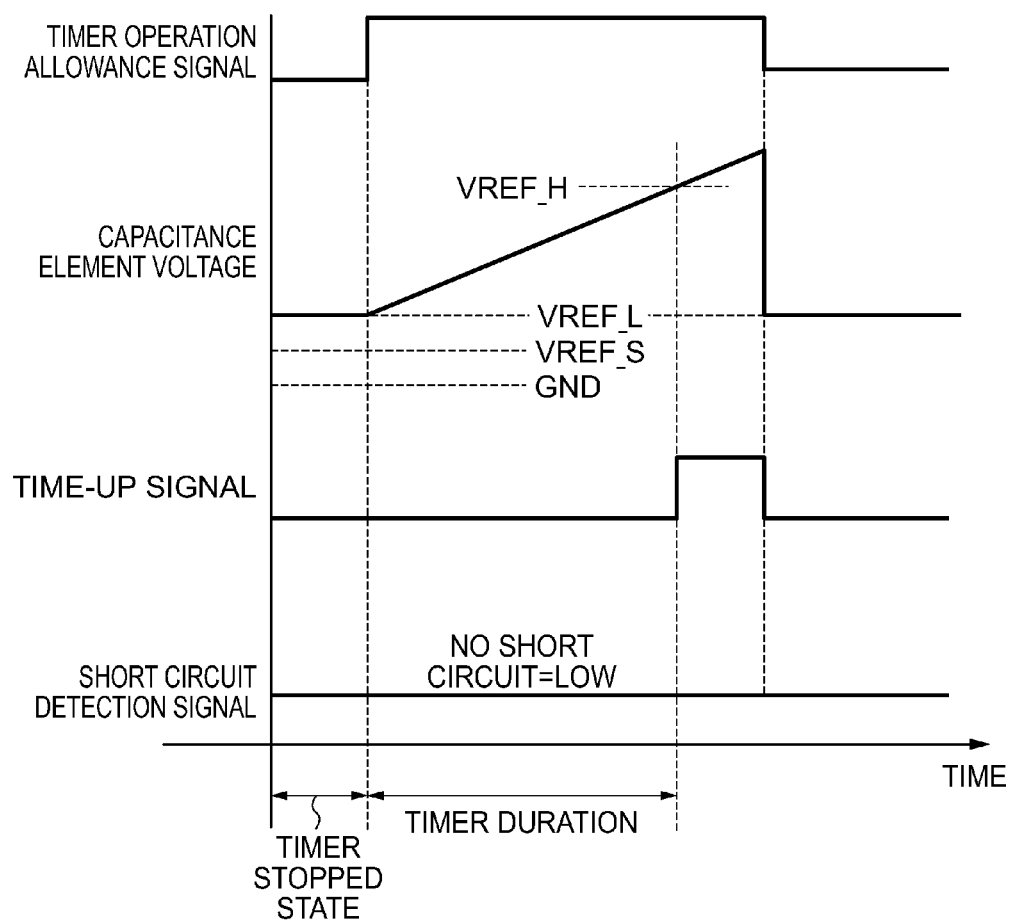
FIG. 6 is a diagram illustrating an operation timing chart of the third embodiment.

FIG. 6 illustrates an operation timing chart of the third embodiment. In a timer stopped state while the timer operation allowance signal is at low level, the discharging circuit 35 is connected to the capacitance element C and the capacitance element C is held at the potential of the reference voltage VREF_L.

Then, when the timer operation allowance signal goes to high level and timer operation starts, the discharging circuit 35 that has been connected to the capacitance element C is disconnected and the charging circuit 20 is connected. Hence, charging of the capacitance element C begins.

Charging of the capacitance element C proceeds, and when the potential reaches the reference voltage VREF_H, the output of the comparator CMP1 changes to high level.

Thus, the timer duration is the duration from when the timer operation allowance signal changes to high level until the output of the comparator CMP1 changes to high level.

After the time-up signal goes to high level, the timer control circuit 80 switches the timer operation allowance signal to low level. After the timer operation allowance signal goes to low level, the capacitance element C is discharged in accordance with a time constant, but FIG. 6 is simplified and does not illustrate this.

Thus, the potential of the capacitance element C is a potential between the reference voltage VREF_L and the power supply voltage VDD. During proper operations, the potential of the capacitance element C does not reach the reference voltage VREF_S whose potential is lower than the potential of the reference voltage VREF_L. Therefore, the short circuit detection signal of the comparator CMP2 is held at low level.

However, if the capacitance element C goes into a short circuit state at the potential level of the ground GND, due to a problem occurring at the capacitance element C or the like, the potential of the capacitance element C goes below the reference voltage VREF_S. Therefore, the short circuit detection signal of the comparator CMP2 goes to high level and notifies the timer control circuit 80 that the capacitance element C is in the short circuit state. The timer control circuit 80 senses this and may, for example, execute timer operations with a different timer circuit or the like.

As described above, according to the third embodiment, because the potential at the start of charging of the capacitance element C is set to the potential of the reference voltage VREF_L that is higher than the GND level, a short circuit of the capacitance element C to the ground GND may be detected, and a timer circuit with high reliability may be realized.

Fourth Embodiment

Figure 7:
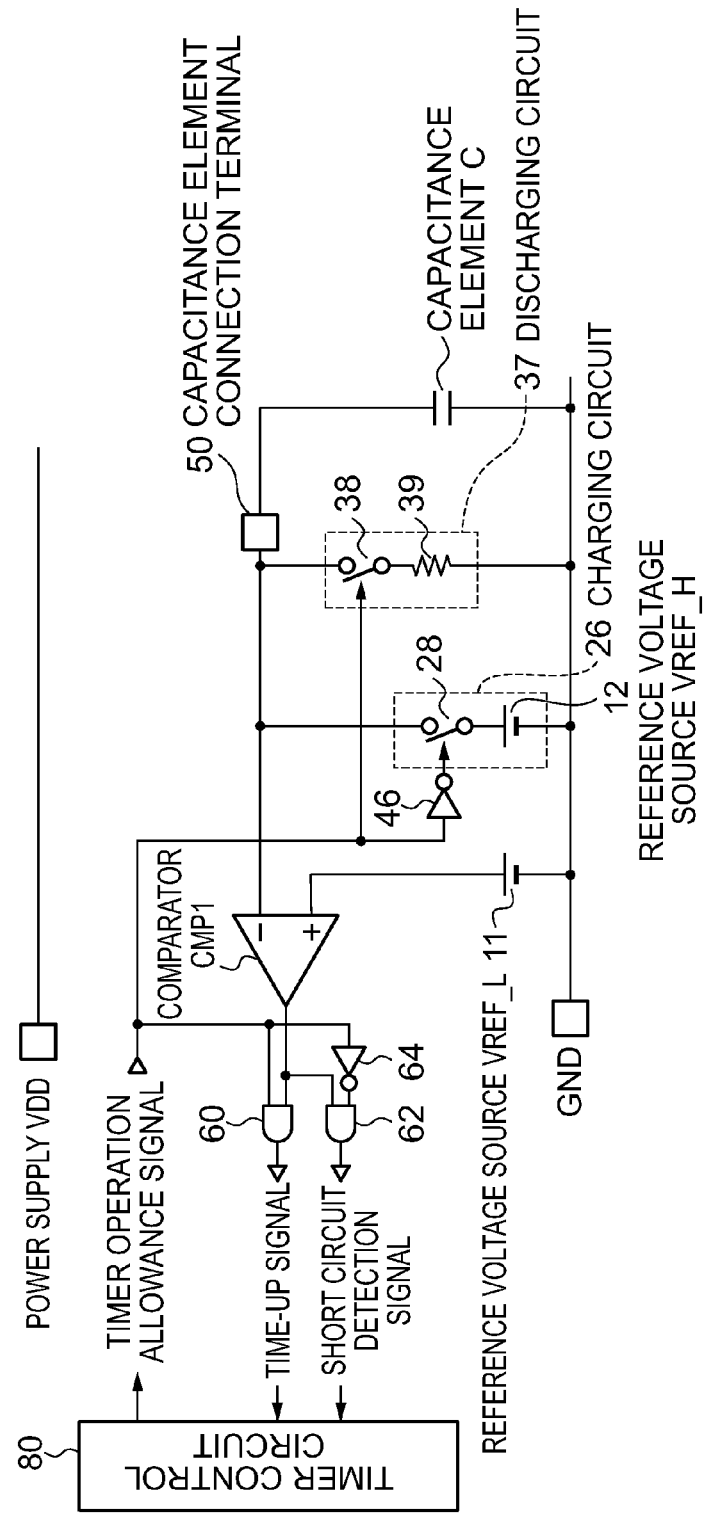
FIG. 7 is a circuit diagram illustrating a timer circuit relating to a fourth embodiment.

FIG. 7 is a circuit diagram illustrating a timer circuit relating to a fourth embodiment. Here, structural elements that are the same as in the timer circuit of the first embodiment that has been described using FIG. 1 are assigned the same reference numerals and are not described in detail.

As illustrated in FIG. 7, the timer circuit relating to the present embodiment is provided with the comparator CMP1, the reference voltage source 11, a charging circuit 26, a discharging circuit 37, AND circuits 60 and 62, and NOT circuits 46 and 64.

The charging circuit 26 is provided with a switch 28 and the reference voltage source 12. One end of the switch 28 is connected to the capacitance element connection terminal 50, and the other end is connected to the positive side of the reference voltage source 12. The negative side of the reference voltage source 12 is connected to the ground GND.

The discharging circuit 37 is provided with a switch 38 and a resistance element 39. One end of the switch 38 is connected to the capacitance element connection terminal 50, and the other end is connected to one end of the resistance element 39. The other end of the resistance element 39 is connected to the ground GND.

The timer operation allowance signal is inverted by the NOT circuit 46 and input to the switch 28 of the charging circuit 26, and the timer operation allowance signal is input to the switch 38 of the discharging circuit 37 without being inverted. Each of the switches 28 and 38 turns on when an input signal is at high level and turns off when an input signal is at low level. Therefore, the charging circuit 26 and the discharging circuit 37 are controlled by the timer operation allowance signal so as to operate exclusively. The timer operation allowance signal is output by the timer control circuit 80.

The negative input terminal of the comparator CMP1 is connected to the capacitance element connection terminal 50.

The reference voltage source 11 is connected to the positive input terminal of the comparator CMP1 and inputs the reference voltage VREF_L.

The output terminal of the comparator CMP1 is connected to one of the two input terminals of the AND circuit 60, and the timer operation allowance signal is input to the other of the two input terminals. In the present embodiment, it is not the output signal of the comparator CMP1, but the output signal of the AND circuit 60, that serves as the time-up signal.

The output terminal of the comparator CMP1 is also connected to one of the two input terminals of the AND circuit 62. The output terminal of the NOT circuit 64 is connected to the other of the two input terminals, and inputs the timer operation allowance signal inverted by the NOT circuit 64. In the present embodiment, the output signal of the AND circuit 62 serves as a short circuit detection signal.

Figure 8:
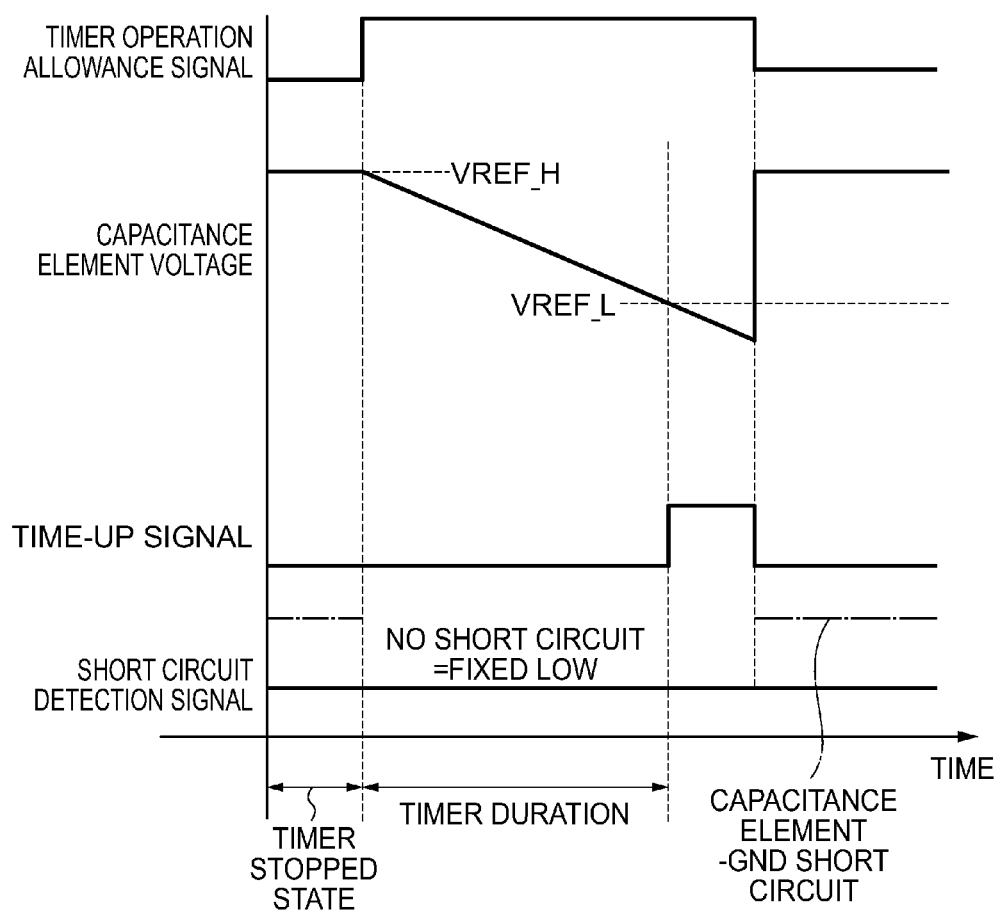
FIG. 8 is a diagram illustrating an operation timing chart of the fourth embodiment.
Figure 9:
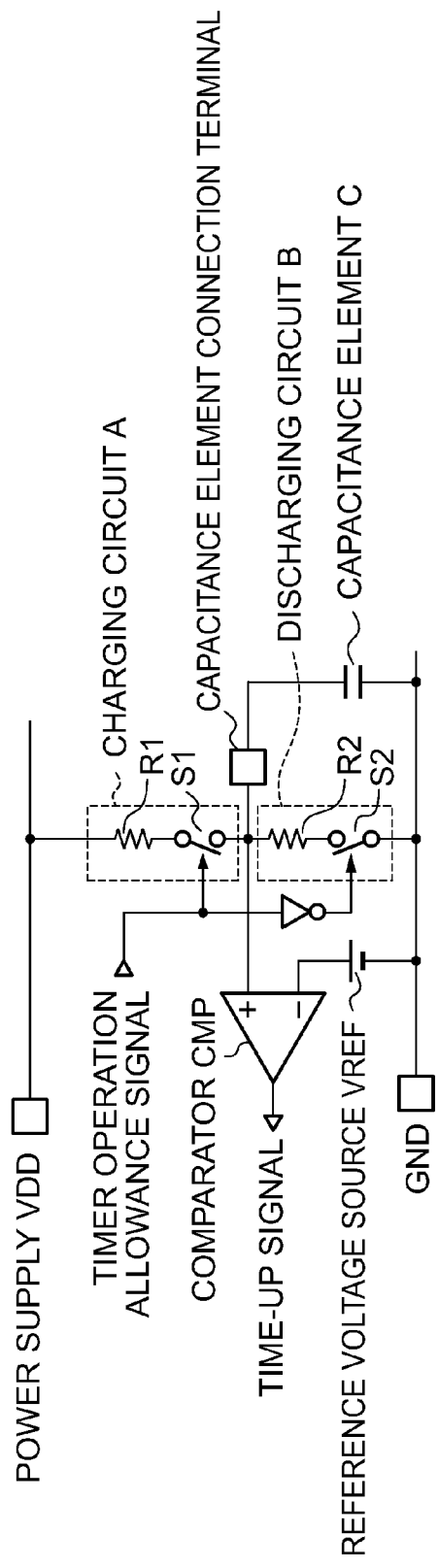
FIG. 9 is a diagram illustrating an example of a circuit diagram of a related art timer circuit.
Figure 10:
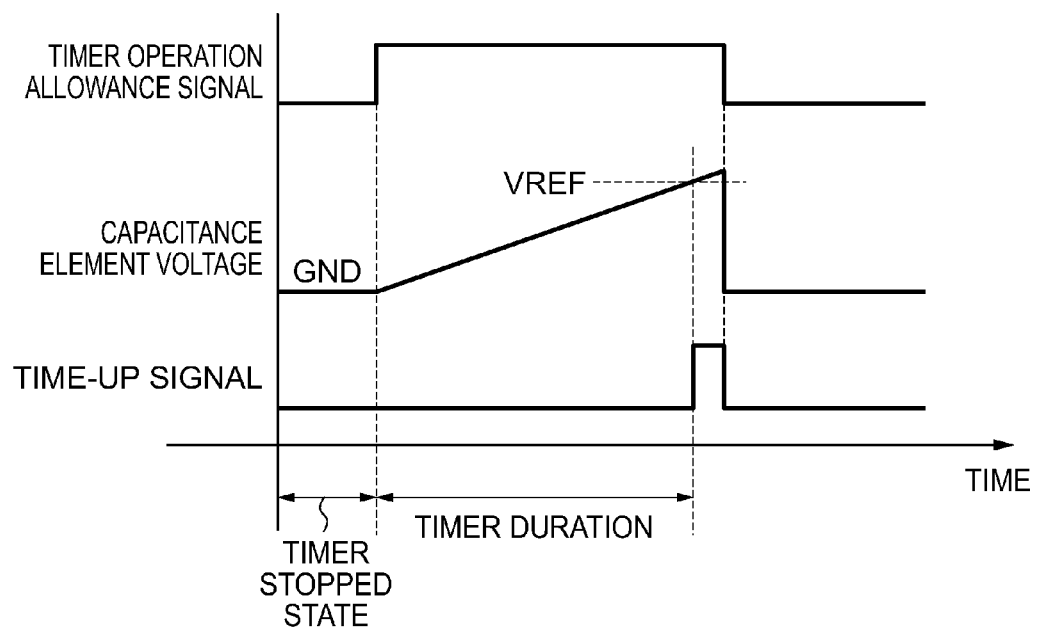
FIG. 10 is a diagram illustrating an operation timing chart of the related art timer circuit.

FIG. 8 illustrates an operation timing chart of the fourth embodiment. In a timer stopped state while the timer operation allowance signal is at low level, the charging circuit 26 is connected to the capacitance element C and the capacitance element C is held at the potential of the reference voltage VREF_H. At this time, the time-up signal output from the AND circuit 60 is held at low level.

Then, when the timer operation allowance signal goes to high level and timer operation starts, the charging circuit 26 that has been connected to the capacitance element C is disconnected and the discharging circuit 37 is connected. Hence, discharging of the capacitance element C begins.

Discharging of the capacitance element C proceeds, and when the potential reaches the reference voltage VREF_L, the output of the comparator CMP1 changes to high level. Therefore, the inputs at both of the two input terminals of the AND circuit 60 are at high-level, and the time-up signal output from the AND circuit 60 changes to high-level.

Thus, the timer duration is the duration from when the timer operation allowance signal changes to high level until the output of the comparator CMP1 changes to high level.

After the time-up signal goes to high level, the timer control circuit 80 switches the timer operation allowance signal to low level. After the timer operation allowance signal goes to low level, the capacitance element C is charged in accordance with a time constant, but FIG. 8 is simplified and does not illustrate this.

If the capacitance element C goes into a short circuit state at the potential level of the ground GND, due to a problem occurring at the capacitance element C or the like, the potential of the capacitance element C goes below the reference voltage VREF_L. Therefore, the output of the comparator CMP1 goes to high level. Hence, in a period in which the time-up signal is at low level, the output of the AND circuit 62 is at high level, and thus notifies the timer control circuit 80 that the capacitance element C is in the short circuit state. The timer control circuit 80 senses this and may, for example, execute timer operations with a different timer circuit or the like.

In the present embodiment, while the timer operation allowance signal is at high level, the output of the AND circuit 62 is always at low level and a short circuit state of the capacitance element C cannot be detected. Therefore, a short circuit state of the capacitance element C will be detected before the timer operation allowance signal is changed from low level to high level.

As described above, according to the fourth embodiment, because the initial value of a voltage value at the capacitance element C at the time of discharging is a high potential, a short circuit of the capacitance element C to the ground GND may be detected with a single comparator. Thus, a timer circuit that incorporates a short circuit detection function may be realized with a small circuit structure.

Variant Embodiments

The first to fourth embodiments described above are configured such that the one end of the capacitance element C is connected to the capacitance element connection terminal 50 and the other end is connected to the ground GND, but this is not a limitation. For example, configurations are possible in which one end of the capacitance element C is connected to the capacitance element connection terminal 50 and the other end is connected to the power supply VDD. If the other end of the capacitance element C is connected to the power supply VDD, when the capacitance element C goes into a short circuit state at the potential of the ground GND due to a problem occurring in the capacitance element C, foreign matter or the like adhering to the circuit or the like, this state may be detected.

In the first, third and fourth embodiments, examples have been described of detecting states in which the capacitance element C is short-circuited to the potential of the ground GND. However, configurations are possible in which states of short-circuiting to the potential of the power supply VDD are detected. The variant embodiments presented below are applicable obviously when the other end of the capacitance element C is connected to the power supply VDD and also when the other end of the capacitance element C is connected to the ground GND.

For example, the timer circuit of the first embodiment illustrated in FIG. 1 may be modified as follows: The capacitance element connection terminal 50 is connected to the positive input terminal of the comparator CMP2 for short circuit detection, and a reference voltage source that generates a reference voltage VREF_SH, whose potential is higher than the potential of the reference voltage VREF_H and lower than the potential of the power supply voltage VDD, is connected to the negative input terminal of the comparator CMP2.

In the timer stopped state, the discharging signal is held at high level and the discharged state of the capacitance element C is maintained. Before the timer starts, the discharging signal is set to low level and the capacitance element C is discharged to the potential of the reference voltage VREF_H. When the potential of the capacitance element C reaches the potential of VREF_H, the time-up signal output from the comparator CMP1 goes to high level. Hence, the timer control circuit 80 senses this, switches the discharging signal to high level, and starts discharging of the capacitance element C (timer is to start).

At this time, the reference voltage VREF_L is input to the negative input terminal of the comparator CMP1, and when the capacitance element reaches the reference voltage VREF_L, the output signal of the comparator CMP1 (the time-up signal) changes to low level.

Thus, the timer duration corresponds to the high level region of the output signal of the comparator CMP1.

Thus, during proper operations, the potential of the capacitance element C does not reach the reference voltage VREF_SH whose potential is higher than the potential of the reference voltage VREF_H. Therefore, the short circuit detection signal of the comparator CMP2 is held at low level.

However, if the capacitance element C goes into a short circuit state at the potential level of the power supply VDD, due to a problem occurring at the capacitance element C or the like, the potential of the capacitance element C is higher than the potential of the reference voltage VREF_SH. Therefore, the short circuit detection signal of the comparator CMP2 goes to high level and notifies the timer control circuit 80 that the capacitance element C is in the short circuit state.

Thus, it may be detected that the capacitance element C is in a short circuit state at the potential of the power supply VDD. This configuration is applicable when the capacitance element C is connected to the power supply VDD, and is also applicable when the capacitance element C is connected to the ground GND.

The timer circuit of the fourth embodiment illustrated in FIG. 7 has a configuration in which the AND circuits 60 and 62 and the NOT circuit 64 are not connected to the output terminal of the comparator CMP1. The comparator CMP3 may be provided to compare the potential of the capacitance element C with the reference voltage VREF_SH, whose potential is higher than the potential of the reference voltage VREF_H and lower than the power supply voltage VDD, and output a short circuit detection signal (see FIG. 3). More specifically, the capacitance element connection terminal 50 is connected to the positive input terminal of the comparator CMP3, and the reference voltage source 14 that generates the reference voltage VREF_SH whose potential is higher than the potential of the reference voltage VREF_H and lower than the power supply voltage VDD is connected to the negative input terminal of the comparator CMP3.

In this case, the output signal of the comparator CMP1 serves as the time-up signal, and in this configuration the timing duration measures time by the discharging period of the capacitance element C. If the capacitance element goes into a short circuit state at the potential of the power supply VDD, the potential of the capacitance element C is higher than the potential of the reference voltage VREF_H. Therefore, the output of the comparator CMP3 is at high level.

Thus, the timer control circuit 80 is notified that the capacitance element C is in the short circuit state.

In the configuration of the third embodiment in FIG. 5, in place of the comparator CMP2, the AND circuits 60 and 62 and the NOT circuit 64 may be provided as illustrated in FIG. 7 at the output terminal of the comparator CMP1 to detect a short circuit. With this configuration, the timer duration measures time by the charging period of the capacitance element C. If the capacitance element goes into a short circuit state at the potential of the power supply VDD, the potential of the capacitance element C is higher than the potential of the reference voltage VREF_H. Therefore, the output of the comparator CMP1 is at high level. Thus, the output of the AND circuit 62 is at high level in the period in which the time-up signal is at low level, and hence the 80 is notified that the capacitance element C is in the short circuit state.

In the first and second embodiments, the charging duration of the capacitance element serves as the timer duration. However, similar circuits may be configured in which the discharging duration of the capacitance element or the duration of both charging and discharging serves as the timer duration. For example, in FIG. 1, the period from when the discharging signal rises until the time-up signal falls may serve as the timer duration, or, in FIG. 3, the duration from when the reference voltage VREF_H is reached until the reference voltage VREF_L is reached may serve as the timer duration.

What is claimed is:

1. A timer circuit utilizing charging or discharging of a capacitance element, the timer circuit comprising:
   a capacitance element;
   a reference potential switching unit in which a first reference potential and a second reference potential that is higher than the first reference potential are input, and that provides an output reference potential to an output reference node by switching the first reference potential and the second reference potential to the output reference node;
   a first judging power supply voltage that outputs a first judging potential that is higher than a ground potential and is lower than the output reference potential;
   a first comparison unit that comprises a first input terminal connected to the capacitance element,
   a second input terminal connected to the reference potential switching unit, and a first output terminal;
   a second comparison unit that comprises a third input terminal connected to the capacitance element, a fourth input terminal connected to the first judging power supply voltage, and a second output terminal; and
   a control unit that comprises a first judging terminal connected to the first output terminal, a second judging terminal connected to the second output terminal, and a switching signal output terminal connected to the reference potential switching unit,
   wherein the first comparison unit outputs a first control signal on the basis of the potentials that are inputted to the first input terminal and the second input terminal,
   the second comparison unit detects that the potential of the capacitance element is out of a pre-specified range on the basis of the potentials that are inputted to the third input terminal and the fourth input terminal, and outputs a first detection signal indicating that a short circuit state of the capacitance element has been detected, and
   the control unit outputs a second control signal switching the reference potential between the first reference potential and the second reference potential from the switching signal output terminal, on the basis of the first control signal that is inputted to the first judging terminal.

2. The timer circuit according to claim 1, wherein the timer circuit further comprises a charging/discharging control unit that controls charging or discharging of the capacitance element, and the control unit outputs a third control signal controlling charging or discharging of the capacitance element to the charging/discharging control unit, on the basis of the first control signal.

3. The timer circuit according to claim 1, wherein the first control signal is a time-up signal.

4. A timer circuit, comprising:
a first circuit configured to electrically interact with a capacitance element, wherein the first circuit includes:
a reference potential switching unit in which a first reference potential and a second reference potential that is higher than the first reference potential are input, and that provides an output reference potential at an output reference node by switching the first reference potential and the second reference potential to the output reference node;
a first comparison unit that includes a first input terminal, a second input terminal, and a first output terminal;
a second comparison unit that includes a third input terminal, a fourth input terminal, and a second output terminal; and
a control unit that includes a first judging terminal connected to the first output terminal, a second judging terminal connected to the second output terminal, and a switching signal output terminal that controls a switching state of the reference potential switching unit so as to switch either the first reference potential or the second reference potential to the output reference node.

5. The timer circuit of claim 4, further comprising
a first judging power supply voltage that outputs a first judging potential that is higher than a ground potential and is lower than the first reference potential; wherein
the first input terminal is connected to the capacitance element, and the second input terminal is connected to the output reference node;
the third input terminal is connected the first input terminal, and the fourth input terminal is connected to the first judging power supply voltage.

6. The timer circuit of claim 5, wherein the second comparison unit detects that a potential of the capacitance element is out of a pre-specified range on the basis of the potentials that are inputted to the third input terminal and the fourth input terminal, and outputs a first detection signal indicating that a short circuit state of the capacitance element has been detected.

7. The timer circuit of claim 6, wherein the control unit controls switching state of the reference potential switching unit on the basis of the first control signal that is inputted to the first judging terminal.

\* \* \* \* \*